United States Patent
Sengupta

(10) Patent No.: US 6,737,179 B2
(45) Date of Patent: May 18, 2004

(54) ELECTRONICALLY TUNABLE DIELECTRIC COMPOSITE THICK FILMS AND METHODS OF MAKING SAME

(75) Inventor: Louise C. Sengupta, Ellicott City, MD (US)

(73) Assignee: Paratek Microwave, Inc., Columbia, MD (US)

( * ) Notice: Subject to any disclaimer, the term of this patent is extended or adjusted under 35 U.S.C. 154(b) by 0 days.

(21) Appl. No.: 09/882,605

(22) Filed: Jun. 15, 2001

(65) Prior Publication Data

US 2002/0034667 A1 Mar. 21, 2002

Related U.S. Application Data

(60) Provisional application No. 60/211,788, filed on Jun. 16, 2000.

(51) Int. Cl.$^7$ ............................................. B32B 18/00
(52) U.S. Cl. ..................... 428/702; 428/699; 428/701; 501/121; 501/137; 501/138
(58) Field of Search ................................ 428/469, 471, 428/472, 697, 699, 701, 702, 332; 501/137, 138, 139, 121

(56) References Cited

U.S. PATENT DOCUMENTS

| | | | |
|---|---|---|---|
| 4,640,905 A | * | 2/1987 | Burn ........................ 361/321.4 |
| 4,643,984 A | | 2/1987 | Abe et al. .................... 501/134 |

(List continued on next page.)

FOREIGN PATENT DOCUMENTS

WO   WO 00/28613   5/2000

OTHER PUBLICATIONS

Babbit et al., "Planar Microwave Electro–Optic Phase Shifters", *Microwave Journal*, Jun. 1992, pp. 63–79.

Sengupta et al., "Novel Ferroelectric Materials for Phased Array Antennas", *IEEE Transactions on Ultrasonics, Ferroelectrics, and Frequency Control*, Jul. 1997, pp. 792–796, vol. 44, No. 4.

Sengupta et al., "Breakthrough advances in low loss, tunable dielectric materials", *Materials Research Innovations*, Mar. 1999, pp. 278–282, vol. 2, No. 5.

Chiu et al., U.S. patent application Ser. No. 09/594,837 filed Jun. 15, 2000.

Sengupta et al., U.S. patent application Ser. No. 09/768,690 filed Jan. 24, 2001.

Chiu et al., U.S. Provisional patent application Ser. No. 60/295,046, filed Jun. 1, 2001.

*Primary Examiner*—Cathy Lam
(74) *Attorney, Agent, or Firm*—Alan G. Towner; James S. Finn

(57) ABSTRACT

Electronically tunable thick film composites of tunable phases such as barium strontium titanate and additional dielectric oxide phases are disclosed. The composite thick films can contain multiple phases such as barium strontium titanate and $MgTiO_3$, $Mg_2SiO_4$, $CaSiO_3$, $MgO$, $MgZrO_3$, $CaTiO_3$, $MgAl_2O_4$, and $MgSrZrTiO_6$. The thick films may contain further additives such as zirconnates, stannates, rare earths, niobates and tantalates, for example, $CaZrO_3$, $BaZrO_3$, $SrZrO_3$, $BaSnO_3$, $CaSnO_3$, $MgSnO_3$, $Bi_2O_3/2SnO_2$, $Nd_2O_3$, $Pr_7O_{11}$, $Yb_2O_3$, $Ho_2O_3$, $La_2O_3$, $MgNb_2O_6$, $SrNb_2O_6$, $BaNb_2O_6$, $MgTa_2O_6$, $BaTa_2O_6$, and $Ta_2O_3$ to improve the electronic and microwave properties of the thick film composites. The particle size of these films may be controlled in order to optimize the electronic and microwave properties. The electronically tunable thick film composites may be made by techniques such as screen-printing or spray deposition.

12 Claims, 13 Drawing Sheets

U.S. PATENT DOCUMENTS

| | | | |
|---|---|---|---|
| 4,968,649 A | | 11/1990 | Tsurumi et al. .............. 501/134 |
| 5,086,021 A | * | 2/1992 | Sasaki et al. ........... 252/520.21 |
| 5,096,642 A | | 3/1992 | Shirasaki ...................... 264/66 |
| 5,114,642 A | | 5/1992 | Jung ............................ 264/61 |
| 5,202,153 A | | 4/1993 | Siuta ........................... 427/125 |
| 5,204,055 A | | 4/1993 | Sachs et al. ..................... 419/2 |
| 5,335,139 A | | 8/1994 | Nomura et al. ................. 361/4 |
| 5,427,988 A | | 6/1995 | Sengupta et al. |
| 5,443,746 A | | 8/1995 | Harris et al. ................ 252/62.9 |
| 5,453,262 A | | 9/1995 | Dawson et al. ............. 423/593 |
| 5,512,196 A | * | 4/1996 | Mantese et al. ........... 252/62.6 |
| 5,557,286 A | * | 9/1996 | Varadan et al. ............. 333/156 |
| 5,578,257 A | | 11/1996 | Van den Sype ............ 264/40.1 |
| 5,593,526 A | | 1/1997 | Yokouchi et al. ............. 156/89 |
| 5,635,433 A | | 6/1997 | Sengupta |
| 5,635,434 A | | 6/1997 | Sengupta |
| 5,672,378 A | | 9/1997 | Maher et al. ................ 427/123 |
| 5,693,429 A | | 12/1997 | Sengupta et al. |
| 5,766,697 A | | 6/1998 | Sengupta et al. |
| 5,830,591 A | * | 11/1998 | Sengupta et al. ........... 385/130 |
| 5,846,893 A | | 12/1998 | Sengupta et al. |
| 5,868,884 A | | 2/1999 | Oiwa et al. ............... 156/89.16 |
| 5,908,802 A | | 6/1999 | Voigt et al. .................. 501/134 |
| 5,948,193 A | | 9/1999 | Cohn et al. .............. 156/89.16 |
| 5,997,800 A | | 12/1999 | Wimberger Friedl et al. ................. 264/603 |
| 6,045,747 A | | 4/2000 | Holm ......................... 264/618 |
| 6,074,971 A | | 6/2000 | Chiu et al. |

* cited by examiner

20 GHz measurements g=10μm

Experimental characteristics of the phase shifter with BSTO capacitors at the T=300K and $U_{bias}$ =0 - 300V

ELECTRONICALLY TUNABLE DIELECTRIC COMPOSITE THICK FILMS AND METHODS OF MAKING SAME

CROSS REFERENCE TO RELATED APPLICATION

This application claims the benefit of U.S. Provisional Application Ser. No. 60/211,788 filed Jun. 16, 2000.

FIELD OF THE INVENTION

The present invention relates to dielectric materials, and more particularly relates to electronically tunable dielectric composite materials provided in the form of relatively thick films. Methods such as screen printing and spray deposition are used to prepare thick film composite materials comprising an electronically tunable phase such as barium strontium titanates and at least one non-tunable phase.

BACKGROUND INFORMATION

Phased array antennas comprise a large number of elements that emit phased signals to form a radio beam. The radio signal can be electronically steered by the active manipulation of the relative phasing of the individual antenna elements. This electronic beam steering concept applies to both the transmitter and the receiver. Phased array antennas are advantageous in comparison with their mechanical counterparts with respect to their speed, accuracy, and reliability. For example, the replacement of gimbal scanned antennas by their electronically scanned counterparts provides more rapid and accurate target identification. Complex tracking exercises can also be performed rapidly and accurately with a phased array antenna system.

Future communications will require wideband communications using frequency-hopping techniques, so that a large amount of digital data can be transferred over a bandwidth. A critical component for these applications is a low cost, fast-acting tunable filter. Digital data could be distributed or encoded over a band of frequencies in a sequence determined by controlling circuitry of the tunable filter. This would allow several users to transmit and receive over a common range of frequencies.

Common varactors used today are silicon and GaAs based. The performance of these varactors is defined by the capacitance ratio, $C_{max}/C_{min}$, frequency range and Q (1/tan δ) at the specified frequency range. The Q factors for these semiconductor varactor for frequencies up to 2 GHz are usually very good. However, at frequencies above 2 GHz, the Q of these varactors degrades rapidly. In fact, at 10 GHz the Q factors for these varactors are usually only about 10.

Barium strontium titanates ($BaTiO_3$—$SrTiO_3$), also referred to as BSTO, is used for its high dielectric constant (200–6,000) and large change in dielectric constant with applied voltage (25–75 percent with a field of 2 Volts/micron). Dielectric materials including barium strontium titanates are disclosed in U.S. Pat. No. 5,427,988 to Sengupta, et al. entitled "Ceramic Ferroelectric Composite Material-BSTO-MgO"; U.S. Pat. No. 5,635,434 to Sengupta, et al. entitled "Ceramic Ferroelectric Composite Material-BSTO-Magnesium Based Compound"; U.S. Pat. No. 5,830,591 to Sengupta, et al. entitled "Multilayered Ferroelectric Composite Waveguides"; U.S. Pat. No. 5,846,893 to Sengupta, et al. entitled "Thin Film Ferroelectric Composites and Method of Making"; U.S. Pat. No. 5,766,697 to Sengupta, et al. entitled "Method of Making Thin Film Composites"; U.S. Pat. No. 5,693,429 to Sengupta, et al. entitled "Electronically Graded Multilayer Ferroelectric Composites"; U.S. Pat. No. 5,635,433 to Sengupta entitled "Ceramic Ferroelectric Composite Material BSTO-ZnO"; U.S. Pat. No. 6,074,971 to Chiu et al. entitled "Ceramic Ferroelectric Composite Materials with Enhanced Electronic Properties BSTO-Mg Based Compound-Rare Earth Oxide"; U.S. application Ser. No. 09/594,837 filed Jun. 15, 2000, entitled "Electronically Tunable Ceramic Materials Including Tunable Dielectric and Metal Silicate Phases"; U.S. application Ser. No. 09/768,690 filed Jan. 24, 2001 entitled "Electronically Tunable, Low-Loss Ceramic Materials Including a Tunable Dielectric Phase and Multiple Metal Oxide Phases"; and U.S. Provisional Application Ser. No. 60/295,046 filed Jun. 1, 2001 entitled "Tunable Dielectric Compositions Including Low Loss Glass Frits". These patents and applications are incorporated herein by reference.

The idea of a voltage tunable dielectric has been proposed for use in antenna applications, as set forth by Richard W. Babbit et al. in a publication entitled "Planar Microwave Electro-Optic Phase Shifters," Microwave Journal, Volume 35 (6), (June 1992). This publication concludes that a need exists for additional research to be conducted in the materials art to yield materials having more desirable electronic properties.

Although various types of tunable dielectric composite materials are known, prior art methods are not conducive to the use of these types of materials in phase shifter applications and phased array antennas at frequencies above 10 GHz which require direct integration into a lithographic antenna design. Also, the dielectric constants of the bulk materials render them impractical or impossible for use in varactors which have capacitances of less than 2 pF, and in co-planar waveguide phase shifters where the impedance of the device includes the low dielectric constant substrate material. For these applications it is desirable to have films from 2–25 microns in thickness and to provide a method for film deposition onto low cost low dielectric constant microwave substrates.

A need has developed for the fabrication of thick film materials having improved electronic properties which may have ideal properties with use in, for example, planar varactors, tunable filters, tunable oscillators, tunable vertical single layer and multi-layer capacitors, co-planar and transmission line phase shifters, and phased array antennas. There is also a need for multi-layered thick films in the multi-layer capacitor industry in order to allow for the creation of tunable vertical capacitors that have large capacitance and are extremely low cost. These capacitors as well as planar capacitors form the basis of high power tunable filters and resonators. Additionally, a need exists for providing a low cost method of impedance matching using multi-layer compositions that have superior electronic properties.

The present invention has been developed in view of the foregoing, and to address other deficiencies of the prior art.

SUMMARY OF THE INVENTION

The present invention provides for the fabrication of electronically tunable dielectric composite thick film materials which reduce or eliminate polishing or pick-and-place techniques for insertion into devices and/or antennas. The thick films of the present invention are particularly useful in integrated antenna designs. The present invention permits printing of phase shifters and antenna elements onto the same substrate, providing a tunable dielectric monolithilic integrated circuit. According to an embodiment of the invention, thick film voltage tunable dielectrics have enhanced electronic properties and are superior to thin film configurations because the thick films have lower loss tangents and are not dependant on substrate materials. Single crystal substrates are not necessary. Therefore, devices incorporating the present thick film composite materials are relatively inexpensive. For example, an entire antenna can be printed in a single pattern by a one-step process.

The electronically tunable thick film composite materials described in preferred embodiments of the present invention can be used to fabricate low cost phased array antennas due to the elimination of low noise amplifiers and other electronics. Also, the deposition of the material onto low cost substrates substantially reduces the cost of the phase shifting elements.

Varactors fabricated from the electronically tunable thick film composites of the present invention can be used independently, or can be integrated into low cost tunable filters. These varactors and filters can be used at numerous frequency ranges, including frequencies above the L-band, in many different commercial and other applications.

An aspect of this invention to provide electronically tunable dielectric composite thick films suitable for use in applications such as phased array antenna systems and the like. The thick film composites of the present invention demonstrate increased tunabilities, reduced loss tangents, lower dielectric constants, the ability to operate at higher frequency due to reduced thicknesses in comparison with bulk ceramics, and the ability to reduce the overall size of the phase shifting components. The present invention also reduces or eliminates the need for machining components. A unique aspect of this invention relative to conventional thin film composites lies in the fact that the thick film composites demonstrate much lower loss tangents, the ability to use low cost microwave substrate materials, and much less expensive deposition costs. The present invention permits printing of phase shifters and antenna elements onto the same substrate in a single step process that does require dicing, bonding and pick-and-place techniques.

Another aspect of the present invention is to provide a method of making electronically tunable dielectric composite thick films. The composites preferably comprise from about 30 to about 99.9 weight percent of an electronically tunable dielectric phase such as barium strontium titanates, and from about 0.1 to about 70 weight percent of at least one additional phase. In addition to the production of single thick film layers, the present invention provides for multilayered deposition with or without interdigitated electrodes using either singular or multiple compositions. The ceramic particle size is preferably controlled to achieve optimal electronic and microwave properties.

A further aspect of the present invention is to provide an electronically tunable thick film dielectric material having a thickness of from about 2 to about 25 microns, preferably from about 3 to about 15 microns.

A further aspect of the present invention is to provide a device comprising a ceramic substrate and an electronically tunable thick film dielectric material deposited on the substrate.

Another aspect of the present invention is to control particle sizes of electronically tunable and non-tunable phases of the dielectric composite in order to control the loss tangents, dielectric constants and tunabilities of the thick films.

A further aspect of the present invention is to the fabricate thick film materials which have sought after properties in, for example, phase array antennas as well as other devices such as tunable filters. The sought after properties include a moderate dielectric constant, low loss tangent and high tunability.

DETAILED DESCRIPTION

Figure 1A:
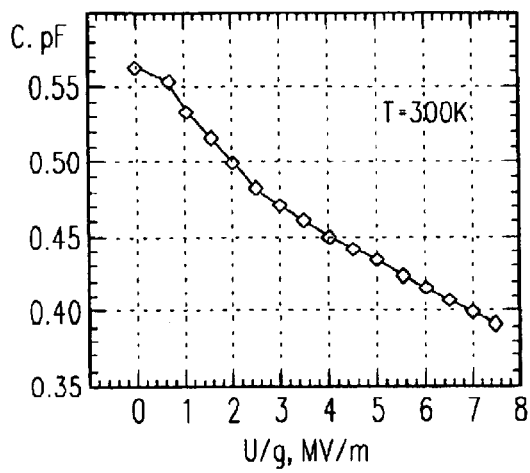
FIGS. 1a–1f are graphs of capacitance and loss tangent versus voltage for a thick film composite, $Ba_{0.60}Sr_{0.40}TiO_3$/20 weight percent MgO, at 3, 10 and 20 GHz.
Figure 1B:
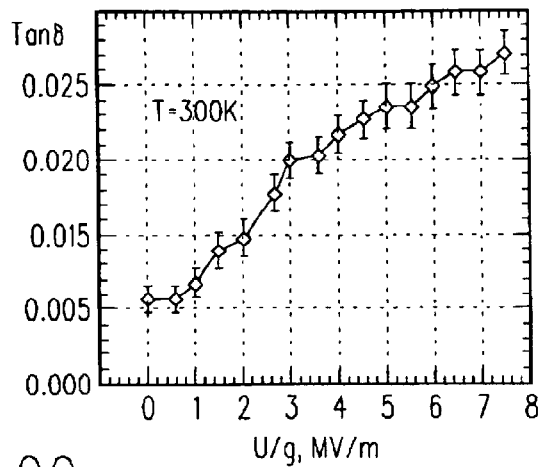
Figure 1C:
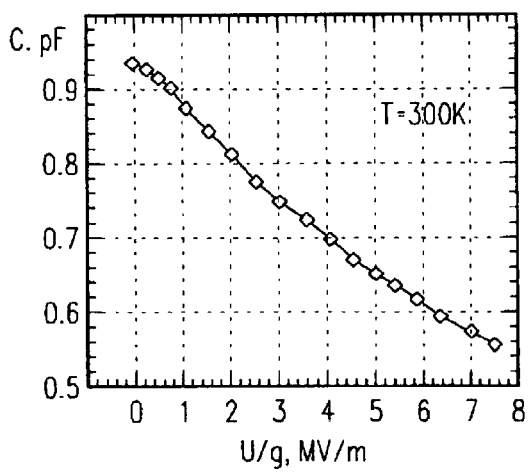
Figure 1D:
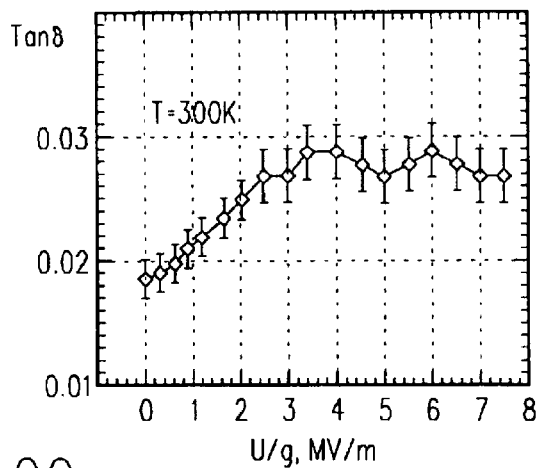
Figure 1E:
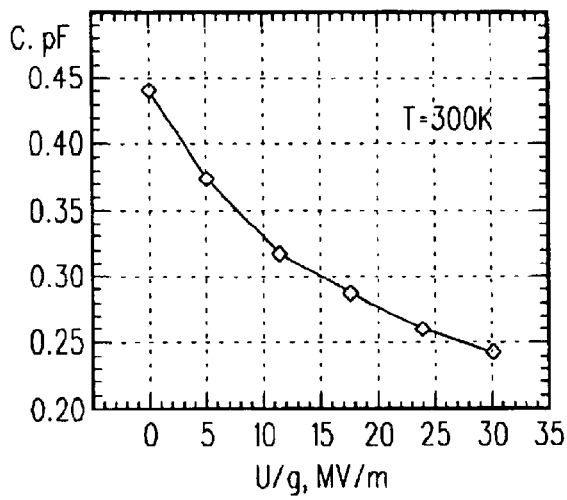
Figure 1F:
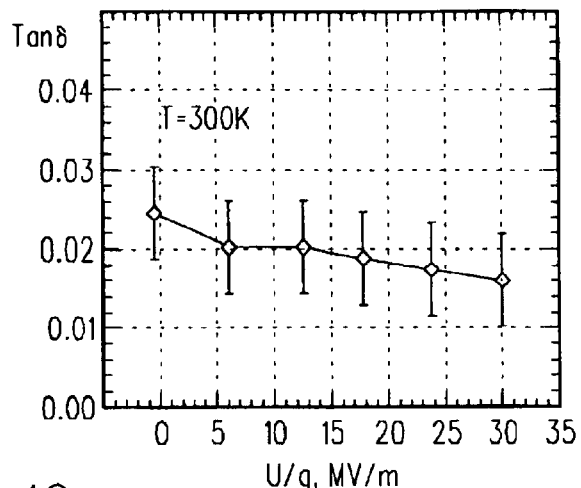

The present invention provides for the fabrication of electronically tunable dielectric composite thick films that have enhanced electronic properties. The thick film composite materials possess several advantages over other currently employed voltage tunable materials. The present thick film materials are preferably designed for dielectric constants of from about 70 to about 1,500, loss tangents of from about 0.005 to about 0.02 (10 GHz), and tunabilities of from about 5 to greater than 50 percent at electric field strengths of 10 V/micron.

The present thick film composite materials preferably comprise a barium strontium titanates ($BaTiO_3$—$SrTiO_3$) electronically tunable phase. However, other electronically tunable dielectric materials may be used partially or entirely in place of barium strontium titanates. An example is $Ba_xCa_{1-x}TiO_3$, where x is from about 0.2 to about 0.8, preferably from about 0.4 to about 0.6. Additional electronically tunable ferroelectrics include $Pb_xZr_{1-x}TiO_3$ (PZT) where x ranges from about 0.05 to about 0.4, lead lanthanum zirconium titanates (PLZT), $PbTiO_3$, $BaCaZrTiO_3$, $NaNO_3$, $KNbO_3$, $LiNbO_3$, $LiTaO_3$, $PbNb_2O_6$, $PbTa_2O_6$, $KSr(NbO_3)$ and $NaBa_2(NbO_3)5KH_2PO_4$.

The additional non-tunable dielectric phase(s) may include MgO, $MgAl_2O_4$, $MgTiO_3$, $Mg_2SiO_4$, $CaSiO_3$, $MgSrZrTiO_6$, $CaTiO_3$, $Al_2O_3$, $SiO_2$ and/or other metal silicates such as $BaSiO_3$ and $SrSiO_3$. The non-tunable dielectric phases may be any combination of the above, e.g., MgO combined with $MgTiO_3$, MgO combined with $MgSrZrTiO_6$, MgO combined with $Mg_2SiO_4$, MgO combined with $Mg_2SiO_4$, $Mg_2SiO_4$ combined with $CaTiO_3$ and the like.

Additional minor additives in amounts of from about 0.1 to about 5 weight percent can be added to the composites to additionally improve the electronic properties of the films. These minor additives include oxides such as zirconnates, tannates, rare earths, niobates and tantalates. For example, the minor additives may include $CaZrO_3$, $BaZrO_3$, $SrZrO_3$, $BaSnO_3$, $CaSnO_3$, $MgSnO_3$, $Bi_2O_3/2SnO_2$, $Nd_2O_3$, $Pr_7O_{11}$, $Yb_2O_3$, $Ho_2O_3$, $La_2O_3$, $MgNb_2O_6$, $SrNb_2O_6$, $BaNb_2O_6$, $MgTa_2O_6$, $BaTa_2O_6$ and $Ta_2O_3$.

The composite materials preferably have controlled particle sizes. Particle sizes of from about 0.2 to about 5 microns are preferred, more preferably from about 0.2 to about 2 microns. The particle size of the electronically tunable phase does not have to be the same size as the non-tunable phase. In many cases the electronically tunable phase particle size is larger than that of the non-tunable phase. However, the electronically tunable phase may be smaller than the non-tunable phase in some embodiments.

Preferred composite thick films of the present invention comprise $Ba_{1-x}Sr_xTiO_3$, where x is from 0.3 to 0.7 in combination with at least one non-tunable dielectric phase selected from MgO, $MgTiO_3$, $MgZrO_3$, $MgSrZrTiO_6$, $Mg_2SiO_4$, $CaSiO_3$, $MgAl_2O_4$, $CaTiO_3$, $Al_2O_3$, $SiO_2$, $BaSiO_3$ and $SrSiO_3$. These compositions can be BSTO and one of these components or two or more of these components in quantities from 0.25 weight percent to 80 weight percent with BSTO weight ratios of 99.75 weight percent to 20 weight percent. A typical composition may be $Ba_{0.55}Sr_{0.45}TiO_3$ (56 weight percent) and $MgTiO_3$ (24 weight percent) and MgO (20 weight percent). The dielectric constant (10 GHz) of this particular material is 364, loss tangent (10 GHz)=0.022, and tunability=22.00 percent at 2.0 V/μm.

As used herein, the term "electronically tunable dielectric material" means a material that exhibits a variable dielectric constant upon the application of a variable voltage and/or current. The term "voltage tunable dielectric material" as used herein means a material that exhibits a variable dielectric constant with a variable applied voltage. Dielectric constant is related to the energy storage in the material, whereas the loss tangent is related to the power dissipation in that same material. In general, the dielectric function is a complex quantity with $\in=\in'-i\in''$ and the loss tangent, $\tan \delta = \in''/\in \sim 0.03$ (at 30 GHz). The tunability may be defined as the dielectric constant of the material with an applied voltage divided by the dielectric constant of the material with no applied voltage. Thus, the percentage tunability may be defined by the formula $T=((X-Y)/X)\cdot 100$, where X is the dielectric constant with no voltage and Y is the dielectric constant with a specific applied voltage.

The tunability of the present thick films, e.g., under an applied electric field of 2.0 V/micron preferably ranges from about 1 to about 60 percent, more preferably from about 5 to about 30 percent, depending on the composition of the thick film employed and the gap size of the metallization utilized in the device.

The thick films encompassed by the present invention are superior in that they are homogeneous, extremely dense, can be deposited on low-cost ceramic substrates, can be deposited in large areas, e.g., up to 12 inches or more, and possess superior electronic properties at both dc voltages and at microwave operating frequencies.

Although thick film printing has been used to deposit various electronic materials, BSTO or other electronically tunable dielectrics have not conventionally been combined with non-tunable dielectric oxides or additives in thick film format to adjust the electronic properties and phase shifting/tunability of thick film materials. The use of the thick film materials in a phased array antenna system in accordance with the present invention enables the fabrication of low cost phased array antennas due to the elimination of low noise amplifiers and other electronics. Also, the deposition of the material onto low cost substrates substantially reduces the cost of the phase shifting elements.

To prepare the present composite materials, powder forms of, for example, $BaTiO_3$ and $SrTiO_3$ or $CaTiO_3$ and $SrTiO_3$ may be combined with the desired additive oxide(s) and mixed to form the desired stiochiometry. The powders may be ball-milled in a solvent such as water or ethanol using alumina or zirconia grinding media for 24 hours. The resulting mixture is air-dried to evaporate the solvent. The powders are then calcined to form the compound of choice. Calcination temperatures are most often 200° C. lower than the final sintering temperatures of the bulk ceramic parts. The sintering temperature of the bulk ceramics may be determined by iteratively firing the parts until the maximum density is achieved. The resulting compounds are then mixed with the oxides and any dopants using the same method as described above. After air-drying the powders, the resulting mixture is blended with a polymeric binder. Suitable vehicles include a solvent such as acetate, xylene or ethanol, a binder such as acrylic, vinyl or ester, a medium such as cellulose, resin or glycol, and optionally glass particles. The percentage of binder to ceramic powders depends on the density and particle size of the ceramic powder, preferably from about 60 to about 80 weight percent oxide powder and from about 20 to about 40 weight percent binder. For example, a typical mixture may be 70 grams of ceramic to 30 grams of binder. The mixture can be milled in an attritor mill or a three roll mill to achieve proper consistency. The resultant slurry can then be applied to the substrate of choice by screen printing or spray techniques, and sintered to fill density. The slurry can be applied as a single composition or multiple layers of varying compositions. These structures can include layers of metal electrodes or buried resistive layers. The sintering temperature of the films may be less than that of the comparable bulk ceramic, e.g., 100 or 200° C. less than the bulk ceramic.

The electronic properties of the present tunable dielectric thick film composites may be adjusted, for example, as listed in Tables 1 and 2. The material designation "55.10" in Table 1 means 90 weight percent $Ba_{0.55}Sr_{0.45}TiO_3$ with 10 weight percent of second phase additive such as $Mg_2SiO_4$. Also in Table 1, the designation "55.30+10%" means $Ba_{0.55}Sr_{0.45}TiO_3$ with 30 weight percent second phase of $MgTiO_3$ plus 10 weight percent MgO. In Table 2, the designation "55.60+$MgTa_2O_6$" means $Ba_{0.55}Sr_{0.45}TiO_3$ with 60 weight percent MgO and 0.5 mol percent $MgTa_2O_6$.

TABLE 1

Dielectric Properties BSTO/Oxide Ceramic Materials

|  | Dielectric 1 MHz | Loss 1 MHz | Dielectric 10 GHz | Loss 10 GHz | Tunability 2 V/μm | Tc ° C. |
|---|---|---|---|---|---|---|
| $Ba_{0.55}Sr_{0.45}TiO_3/Mg_2SiO_4$ | | | | | | |
| 55.10 | 1508.7 | 0.00026 |  |  | 18.08% |  |
| 55.20 | 857.9 | 0.0003 | 726.29 | 0.02 | 15.10% |  |
| 55.30 | 315 | 0.0009 | 211.54 | 0.0177 | 17.35% | −30 |
| 55.40 | 277.38 | 0.0004 | 225.67 | 0.0185 | 16.80% |  |
| 55.50 | 79.82 | 0.0005 | 76.46 | 0.0145 | 10.06% |  |
| 55.60 | 64.79 | 0.0003 | 46.4 | 0.0087 | 6.72% |  |
| $Ba_{0.55}Sr_{0.45}TiO_3/CaSiO_3$ | | | | | | |
| 55.10 | 740.5 | 0.0006 |  |  | 9.57% |  |
| 55.15 | 347.7 | 0.0019 |  |  | 4.03% |  |
| 55.20 | 138.2 | 0.0012 |  |  | 0.31% |  |
| 55.30 | 84.5 | 0.00018 |  |  | 0.20% |  |
| $Ba_{0.55}Sr_{0.45}TiO_3/MgSrTiO_6$ | | | | | | |
| 55.20 | 780 | 0.0012 |  |  | 16.30% | −30 |
| 55.25 | 590 | 0.001 |  |  | 14.70% | −35 |
| 55.30 | 371 | 0.0009 |  |  | 14.00% | −40 |
| 55.40 | 179.8 | 0.0006 |  |  | 6.40% |  |
| 60.30 | 521 | 0.0013 |  |  | 17.60% | −25 |
| $Ba_{0.55}Sr_{0.45}TiO_3/CaTiO_3$ | | | | | | |
| 55.20− | 1941.6 | 0.0011 |  |  | 26.50% | −35 |
| 55.60− | 319.2 | 0.0008 |  |  | 0.55% |  |
| $Ba_{0.55}Sr_{0.45}TiO_3/MgTiO_3/MgO$ | | | | | | |
| 55.30 + 10% | 788 | 0.00066 | 598 | 0.025 | 27.10% | −20 |
| 55.30 + 20% | 460 | 0.00068 | 364 | 0.022 | 22.00% | −20 |
| 55.30 + 50% | 72.8 | 0.00046 | 68.29 | 0.013 | 6.20% | −25 |
| 55.30 + 60% | 43.8 | 0.00088 | 45.12 | 0.0077 | 2.40% | −30 |
| $Ba_{0.55}Sr_{0.45}TiO_3/MgSrZrTiO_6/MgO$ | | | | | | |
| 55.30 + 10% | 775 | 0.00042 | 597 | 0.0277 | 25.90% | −25 |
| 55.30 + 20% | 546 | 0.00081 | 382 | 0.0232 | 20.00% | −30 |
| 55.30 + 50% | 80.6 | 0.00044 | 74.23 | 0.0106 | 7.90% | −35 |
| 55.30 + 60% | 49.9 | 0.00099 | 47.11 | 0.0081 | 3.60% | −40 |
| $Ba_{0.55}Sr_{0.45}TiO_3/MgAl_2O_4/MgO$ | | | | | | |
| 55.40 + 20% | 204.6 | 0.0015 |  |  | 13.80% | −30 |
| 55.60 + 20% | 69.5 | 0.0015 | 57.3 | 0.029 | 11.00% | −25 |
| $Ba_{0.55}Sr_{0.45}TiO_3/Mg_2SiO_4/MgO$ | | | | | | |
| 45.50 + 1% | 129.7 | 0.0013 | 107.16 | 0.0155 | 7.3% |  |
| 45.50 + 2% | 134.4 | 0.0015 |  |  | 9.3% |  |
| 45.50 + 3% | 133.1 | 0.0033 |  |  | 7.9% | −60 |
| 45.50 + 5% | 111.9 | 0.0029 |  |  | 9.5% | −60 |
| 45.55 + 1% | 96.0 | 0.0013 | 80.99 | 0.0118 | 6.7% |  |
| 45.55 + 2% | 99.0 | 0.0024 |  |  | 7.8% | −55 |
| 45.55 + 3% | 90.6 | 0.0021 |  |  | 7.0% | −55 |
| 45.55 + 5% | 101.9 | 0.0023 |  |  | 9.9% | −60 |
| 50.40 + 1% | 400.6 | 0.0012 |  |  | 26.2% | −20 |
| 50.40 + 5% | 437.9 | 0.0016 |  |  | 24.8% | −30 |
| 55.30 + 5% | 432.2 | 0.0013 |  |  | 11.4% | −40 |

TABLE 1-continued

Dielectric Properties BSTO/Oxide Ceramic Materials

| | Dielectric 1 MHz | Loss 1 MHz | Dielectric 10 GHz | Loss 10 GHz | Tunability 2 V/$\mu$m | Tc °C. |
|---|---|---|---|---|---|---|
| 55.30 + 20% | 234.0 | 0.0021 | | | 8.0% | |
| 55.60 + 30% | 31.3 | 0.0029 | | | 2.1% | |
| $Ba_{0.55}Sr_{0.45}TiO_3/CaTiO_3/Mg_2SiO_4$ | | | | | | |
| 55.20 + 10% | 876.6 | 0.0024 | | | 15.9% | |
| 55.20 + 20% | 596.6 | 0.0032 | | | 19.4% | |
| 55.20 + 40% | 266.0 | 0.0023 | | | 6.5% | |

TABLE 2

Dielectric Properties of BSTO/Oxide Bulk Ceramic Materials with Selected Additives

| | Dielectric 1 MHz | Loss 1 MHz | Dielectric 10 GHz | Loss 10 GHz | Tunability 2 V/$\mu$m | Tc °C. |
|---|---|---|---|---|---|---|
| $Ba_{0.55}Sr_{0.45}TiO_3/MgO/0.5$ mol % Rare Earth Oxides) | | | | | | |
| 55.60 + $CeO_2$ | 100.8 | 0.00089 | | 0.0069 | 4.77% | −65 |
| 55.60 + $La_2O_3$ | 91.4 | 0.0003 | 95.76 | 0.0115 | 7.18% | −80 |
| 55.60 + $Dy_2O_3$ | 104.7 | 0.0004 | 104.08 | 0.014 | 4.44% | −70 |
| 55.60 + $Er_2O_3$ | 106.7 | 0.0016 | 107.38 | 0.019 | 4.44% | −75 |
| 55.60 + $Sm_2O_3$ | 100.5 | 0.0004 | 109.5 | 0.0358 | 5.25% | −75 |
| 55.60 + $Yb_2O_3$ | 109.6 | 0.0011 | 101.87 | 0.01 | 4.86% | −80 |
| 55.60 + $Gd_2O_3$ | 89.1 | 0.00081 | | | 4.85% | |
| 55.60 + $Ho_2O_3$ | 92.5 | 0.00059 | 95.13 | 0.0119 | 4.81% | |
| 55.60 + $Pr_7O_{11}$ | 52.8 | 0.00087 | 52.15 | 0.0059 | 3.38% | |
| 55.60 + $Yb_2O_3$ | 96.1 | 0.0016 | 95.25 | 0.0377 | 5.41% | |
| 55.40 + $Pr_7O_{11}$ | 200.4 | | 169.1 | 0.0086 | 5.30% | |
| $Ba_{0.55}Sr_{0.45}TiO_3/MgO/0.5$ mol % Zirconnates | | 0.00042 | | | | |
| 55.60 + $SrZrO_3$ | 100.1 | 0.00048 | | | 5.50% | −50 |
| 55.60 + $BaZrO_3$ | 94.5 | 0.00052 | | | 6.10% | |
| 55.60 + $CaZrO_3$ | 98 | | | | 6.20% | |
| $Ba_{0.55}Sr_{0.45}TiO_3/MgO/0.5$ mol % Stannates | | 0.00046 | | | | |
| 55.60 + $BaSnO_3$ | 76 | 0.00048 | | | 4.30% | −50 |
| 55.60 + $CaSnO_3$ | 77.6 | 0.0006 | | | 4.00% | −50 |
| 55.60 + $MgSnO_3$ | 88.5 | | 93.6 | 0.0065 | 7.10% | |
| $Ba_{0.55}Sr_{0.45}TiO_3/MgO/0.5$ mol % Niobates | | 0.00067 | | | | |
| 55.60 + $MgNb_2O_6$ | 93.1 | 0.00085 | 93.3 | 0.0089 | 7.20% | |
| 55.60 + $SrNb_2O_6$ | 98.4 | 0.0007 | | | 6.30% | |
| 55.60 + $BaNb_2O_6$ | 96.7 | | | | 6.60% | |
| $Ba_{0.55}Sr_{0.45}TiO_3/MgO/0.5$ mol % Tantalates | | 0.00091 | | | | |
| 55.60 + $MgTa_2O_6$ | 85.1 | 0.00085 | 83.7 | 0.0087 | 6.20% | |
| 55.60 + $BaTa_2O_6$ | 91 | | | | 7.00% | |

The electronically tunable thick film composites listed in Tables 1 and 2 have loss tangents and dielectric constants that can be used, for example, for antenna applications. The composition of the thick films can be adjusted as to produce electronic properties which can be tailored for use in various devices such as varactors, phase shifters, filters, and in integrated phased array antennas.

The C(pF) and loss tangents for $Ba_{0.60}Sr_{0.40}TiO_3$ (60 weight percent) and MgO (20 weight percent) thick film on MgO substrate are shown in FIGS. 1a–1f at frequencies of 3, 10 and 20 GHz. As shown in the figures, the change in capacitance is approximately 2 to 1 at all frequencies measured, and the loss does not exceed 0.02 even at frequencies up to 20 GHz.

Figure 2A:
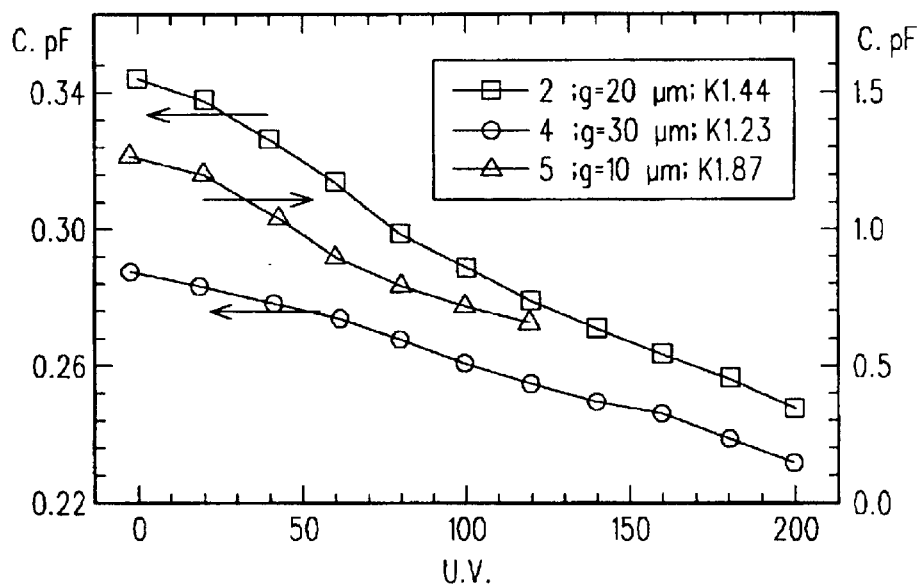
FIGS. 2a and 2b are graphs of capacitance and loss tangent versus voltage for thick film composites of various compositions at 10 GHz. Sample No. 2 comprises $Ba_{0.60}Sr_{0.40}TiO_3$/20 weight percent MgO; Sample No. 4 comprises $Ba_{0.55}Sr_{0.45}TiO_3$/20 weight percent MgO; and Sample No. 5 comprises $Ba_{0.55}Sr_{0.45}TiO_3$/30 weight percent MgO.
Figure 2B:
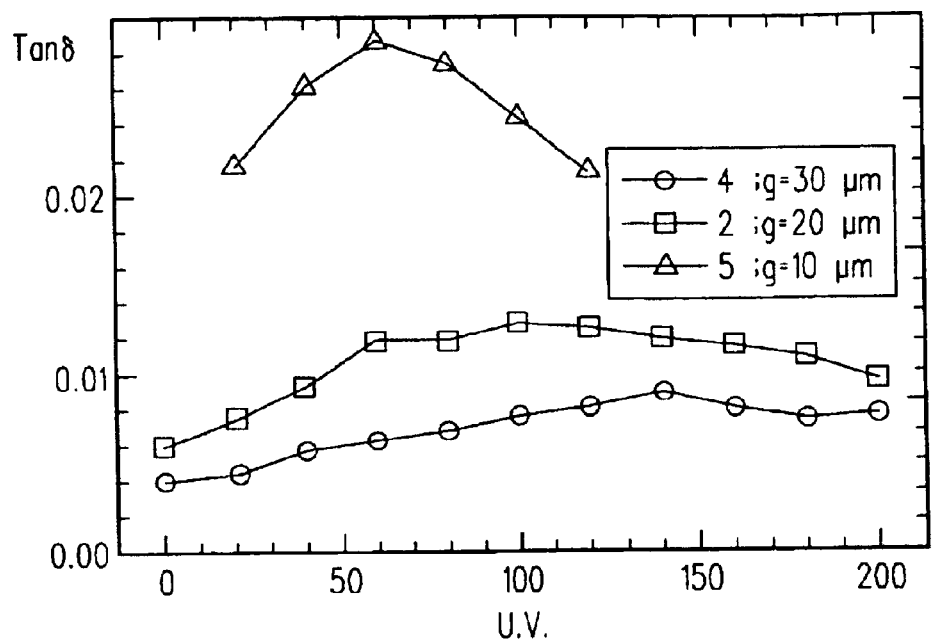
Figure 3A:
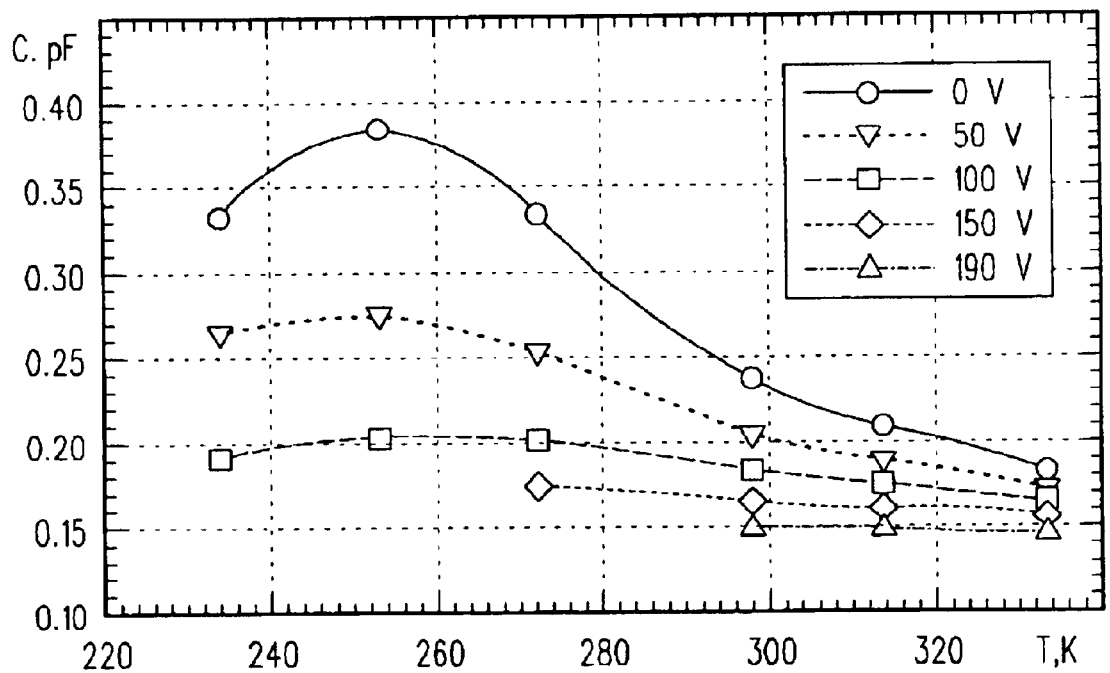
FIGS. 3a and 3b are graphs of capacitance and loss tangent versus voltage and temperature for a $Ba_{0.60}Sr_{0.40}TiO_3$/20 weight percent MgO thick film at 20 GHz.
Figure 3B:
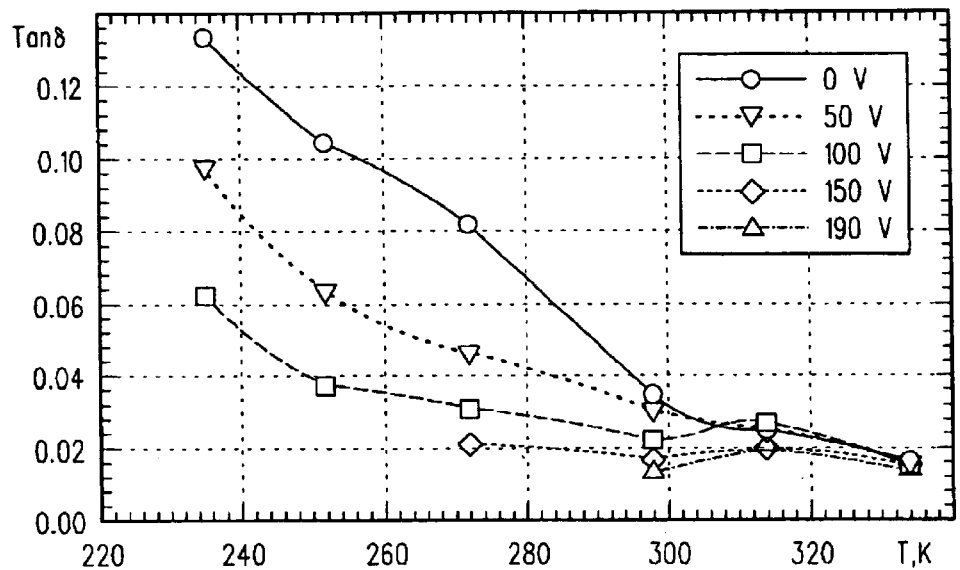
Figure 4A:
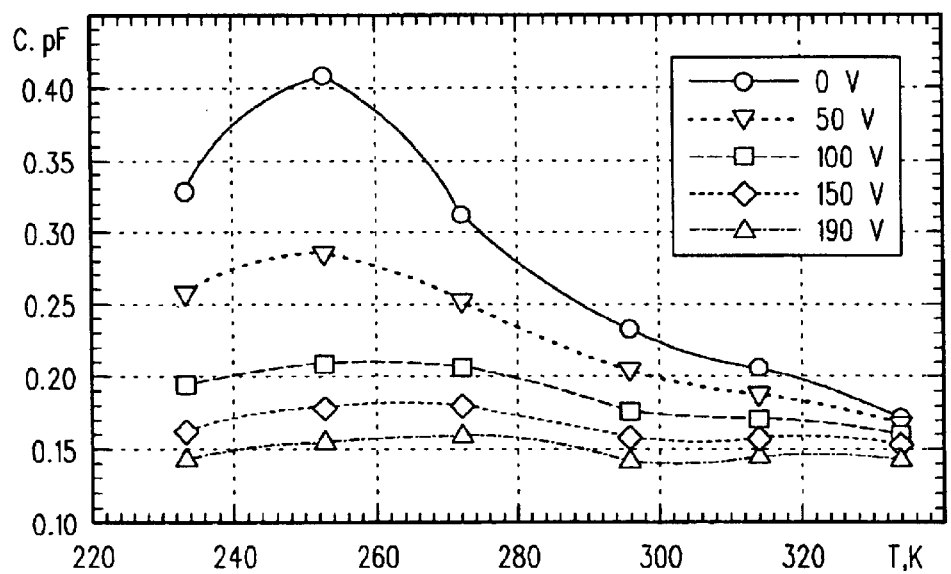
FIGS. 4a and 4b are graphs of capacitance and loss tangent versus voltage and temperature for a $Ba_{0.60}Sr_{0.40}TiO_3$/20 weight percent MgO thick film at 30 GHz.
Figure 4B:
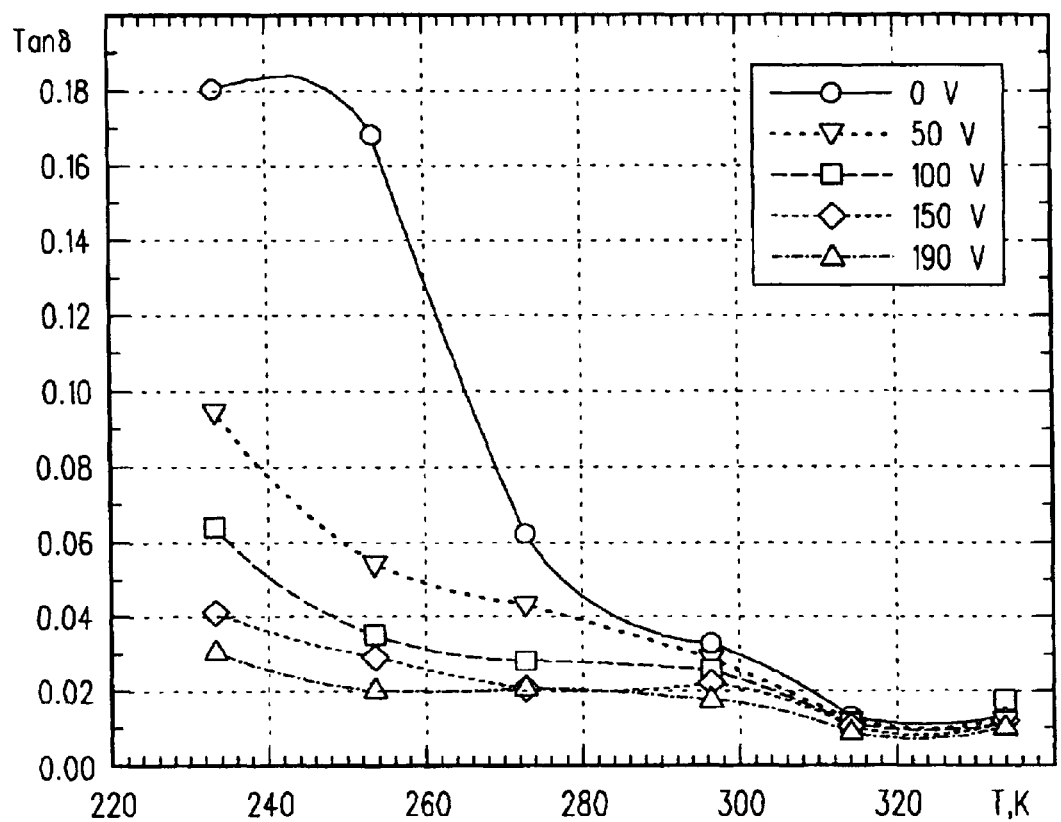

In FIGS. 2a and 2b the loss tangent and capacitance for various compositions are shown (Sample No. 2=$Ba_{0.60}Sr_{0.40}TiO_3$/20 weight percent MgO; Sample No. 4=$Ba_{0.55}Sr_{0.45}TiO_3$/20 weight percent MgO; and Sample No. 5=$Ba_{0.55}Sr_{0.45}TiO_3$/30 weight percent MgO). As shown in FIG. 2b, the loss tangents for two of the compositions are less than 0.012 at all bias applications.

In FIGS. 3a, 3b, 4a and 4b, the capacitance and loss tangent of the $Ba_{0.60}Sr_{0.40}TiO_3$ (60 weight percent) and MgO (20 weight percent) thick film on a MgO substrate is shown as a function of applied voltage and temperature at frequencies of 20 and 30 GHz. The capacitance and loss increase as the temperature is decreased, although the loss does not exceed 0.02 at room temperature. Therefore, the recommended operating range for this particular thick film composition is above −30 C.

As shown in the above figures, the loss tangents and capacitance decrease with increases in applied voltage. Also as shown in the figures, the loss tangents for the materials are about 0.005 (Q=1/loss tangent=200) at 3 GHz, 0.013 at 10 GHz (Q=80) and 0.02 at 20 GHz (Q=50). The Curie temperature for this composition of thick film is approximately −30° C. Therefore, the loss and capacitance without an applied voltage increase at −30° C.

The dielectric constants and the loss tangents measured at 1–3 GHz for various compositions of thick film tunable planar varactors deposited on MgO are shown in Table 3.

TABLE 3

Voltage Tunable Thick Film Planar Varactor Data
(20 micron gap) (film thickness = 4–6 μm)

| Material | Frequency | Dielectric Constant | Loss Tangent | $C_{BIAS}/C_0$ | Applied Electric Field |
|---|---|---|---|---|---|
| 60.20 | 1.5 GHz | 980 | 0.0025 | 1.875 | 15 V/μm |
| 55.30 | 1.5 GHz | 825 | 0.0025 | 1.8–2.0 | 10–12 V/μm |
| 55.30 | 3.0 GHz | 780 | 0.005 | | |
| 55.20 | 1.5 GHz | 650 | 0.0022 | 1.8–2.2 | 10–15 V/μm |
| 60.40 | 1.5 GHz | 425 | 0.0020 | 1.6 | 10 V/μm |
| 55.40 | 1.5 GHz | 250 | 0.0018 | 1.8 | 17 V/μm |

The material designations in Table 3 are equivalent to the following compositions: 60.20=$Ba_{0.60}Sr_{0.40}TiO_3$ (60 weight percent) and MgO (20 weight percent); 55.30=$Ba_{0.55}Sr_{0.45}TiO_3$ (60 weight percent) and MgO (30 weight percent); 55.20=$Ba_{0.55}Sr_{0.45}TiO_3$ (60 weight percent) and MgO (20 weight percent); 55.40=$Ba_{0.55}Sr_{0.45}TiO_3$ (60 weight percent) and MgO (40 weight percent); and 60.40=$Ba_{0.60}Sr_{0.40}TiO_3$ (60 weight percent) and MgO (40 weight percent). The Q values of the materials listed in Table 3 are about 200–500 at these frequencies.

Table 4 contains the 10 GHz data for similar thick compositions on MgO substrates onto which interdigitated varactors have been patterned (60.60=$Ba_{0.60}Sr_{0.40}TiO_3$ (60 weight percent) and MgO (60 weight percent). These varactors have Q's as high as 90–100.

TABLE 4

Voltage Tunable Thick Film Interdigitated Electrode (IDE)
Varactors measured at 10 GHz (film thickness = 4–6 μm)

| Material | Dielectric Constant | Loss Tangent | Tunability (%) | GAP (μm) | Finger Length (μm) |
|---|---|---|---|---|---|
| 60.60 | 118 | 0.0156 | 26 | 8 | 80 |
| 55.40 | 291 | 0.0149 | 12.2 | 10 | 80 |
| 55.20 | 704 | 0.0103 | 13.9 | 10 | 80 |
| 55.30 | 527 | 0.0120 | 23.7 | 6 | 80 |
| 60.40 | 423 (5 GHz) | 0.009 (5 GHz) | 31.6 (5 GHz) | 6 (5 GHz) | 80 (5 GHz) |
| 60.40 | 395 | 0.013 | | | |

The switching speed of the $Ba_{0.60}Sr_{0.40}TiO_3$ (60 weight percent) and MgO (20 weight percent) thick film is extremely fast, e.g, 90–95 percent of the switching occurs in about 30 ns, with a small percentage, e.g., 5 percent occuring in 10–20 μs. The switching speed of these films is therefore very rapid.

Figure 5:
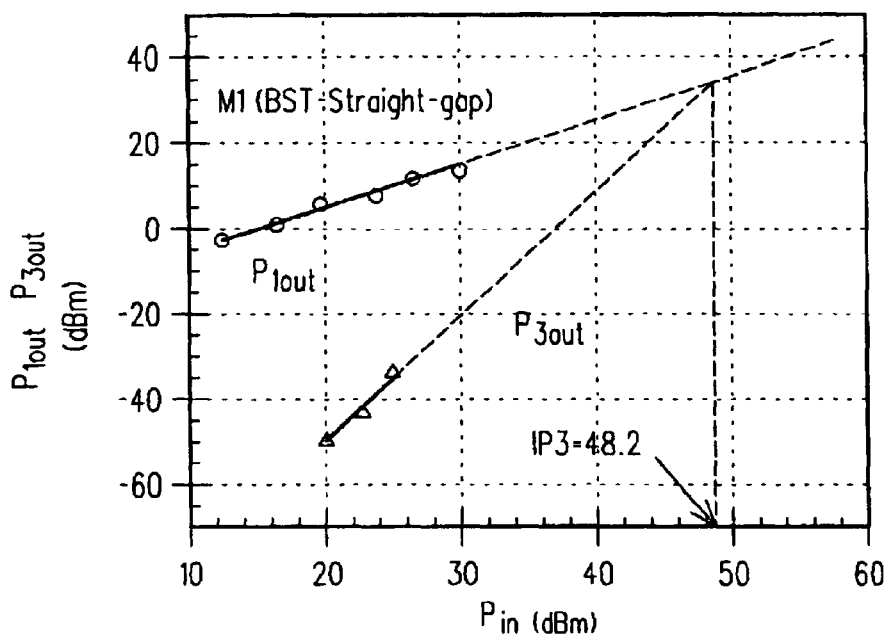
FIG. 5 is a graph illustrating the intermodulation distortion of a thick film composite of the present invention.

The intermodulation distortion of the $Ba_{0.60}Sr_{0.40}TiO_3$ (60 weight percent) and MgO (20 weight percent) thick film is shown in FIG. 5. The third order intermodulation products (IP3) of the film is greater than 48 dBm at an input power level of 0.5 Watts.

Additionally, control of the particle size of the starting materials can further modify the thick film composite properties described above. This can be done, for example, by the addition of nano-size BSTO to the micron size BSTO matrix, or by reducing the overall particle size of the BSTO.

The results for the $Ba_{0.60}Sr_{0.40}TiO_3$ (60 weight percent) and MgO (20 weight percent) on MgO substrate thick films are shown in Table 5.

TABLE 5

Thick Film IDE Varactors with reduced particle size BSTO
measured at 10 GHz (film thickness = 4–6 μm)

| Material | Dielectric Constant | Freq. | GAP (μm) | Finger Length (μm) | Tunability (%) | Loss Tangent |
|---|---|---|---|---|---|---|
| 60.20 micron | 980 | 5 GHz | 6 | 80 | 24.2 | 0.025 |
| 60.20 sub-micron | 850 | 5 GHz | 6 | 80 | 31.6 | 0.008 |
| 60.20 nano-size | 840 | 10 GHz | 8 | 80 | 27.6 | 0.013 |

As shown in Table 5, use of either sub-micron size and/or nano-size starting materials reduces the insertion loss of the composite thick films and increases the tunability (applied electric field of 5–6.7/micron).

Figure 6A:
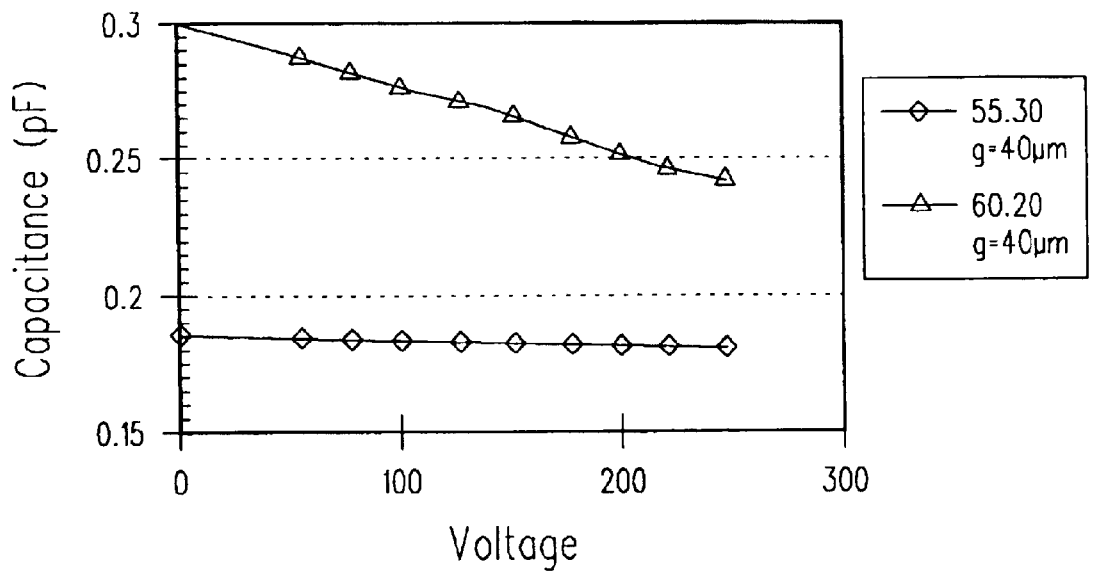
FIGS. 6a and 6b are graphs of the capacitance and the loss tangent versus voltage for a controlled particle size composite thick film of the present invention.
Figure 6B:
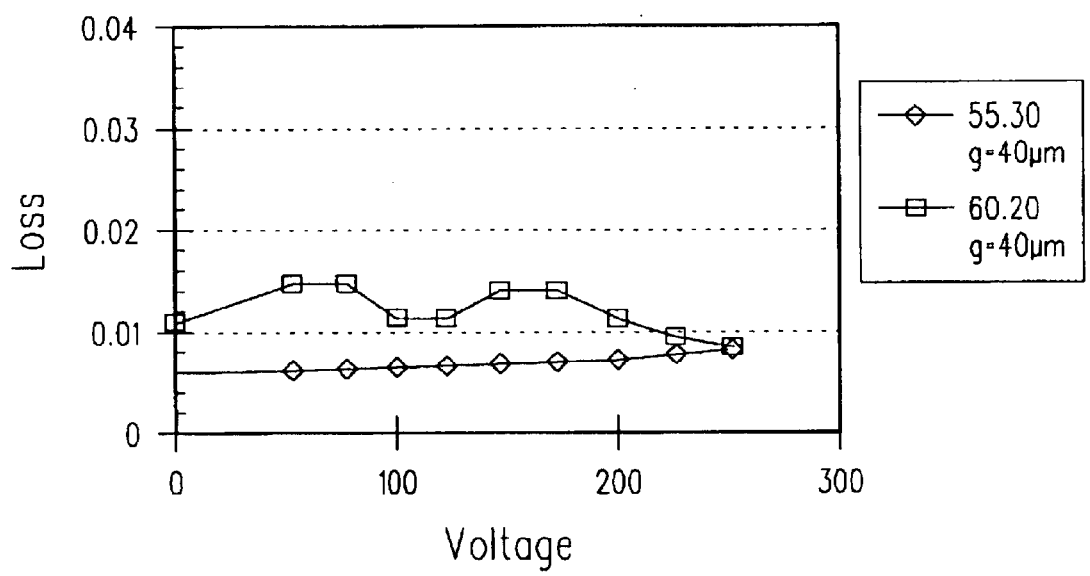

The capacitance and loss tangent for a reduced particle size BSTO composite film listed in Table 5 is shown FIGS. 6a and 6b. Reducing the particle size reduces the loss tangent without reducing the tunability.

The thick film composite materials can be deposited onto non-single crystal substrate materials such as alumina. The results for a $Ba_{0.60}Sr_{0.40}TiO_3$ (60 weight percent) and MgO (20 weight percent) thick film deposited on a alumina substrate are shown in Table 6.

TABLE 6

Thick Film IDE Varactors deposited onto both single crystal (MgO) and
ceramic ($Al_2O_3$) substrates measured at 10 GHz (film thickness = 4–6 μm)

| Material | Dielectric Constant | Freq. | GAP (μm) | Finger Length (μm) | Tunability (%) | Loss Tangent |
|---|---|---|---|---|---|---|
| 60.20 MgO substrate (single crystal) | 980 | 5 GHz | 6 | 80 | 24.2 | 0.025 |
| 60.20 alumina substrate (ceramic) | 825 | 10 GHz | 6 | 60 | 12.8 | 0.026 |

The present voltage tunable dielectric varactors have Q factors of about 80–500 from 1–40 GHz. In addition, the tunable dielectric varactors have increased RF power handling capability and reduced power consumption and cost. The thick film voltage tunable planar varactors have a planar electrode with a predetermined gap distance on a single or multiple layer thick film. The applied voltage produces an electric field across the gap of the tunable dielectric which produces an overall change in the capacitance of the varactor. The width of the gap can range from 10 to 50 μm depending on the performance requirements. The varactor can be in turn integrated into a myriad of tunable devices such as those commonly used in conduction with semiconductor varactors. Examples of these are phase shifters and tunable filters. Other devices include those listed at various other frequencies as well as many other devices such as resonators, switches and voltage controlled oscillators. Commercial applications for the thick film varactors include (a) L-band (1–2 GHz) tunable filters for wireless LAN systems, and PCS systems, and (b) $K_u$ band (12–18 GHz) for use in Direct TV and (e) $K_A$ band tunable filters for satellite communications and LMDS systems.

Figure 7A:
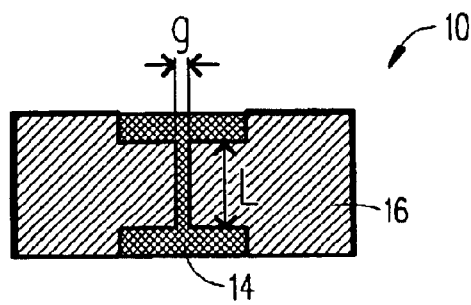
FIGS. 7a and 7b are top and side views schematically illustrating a planar varactor fabricated from a thick film composite of the present invention.
Figure 7B:
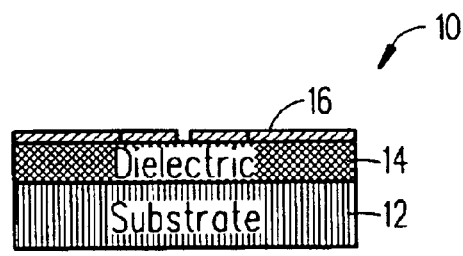
Figure 8:
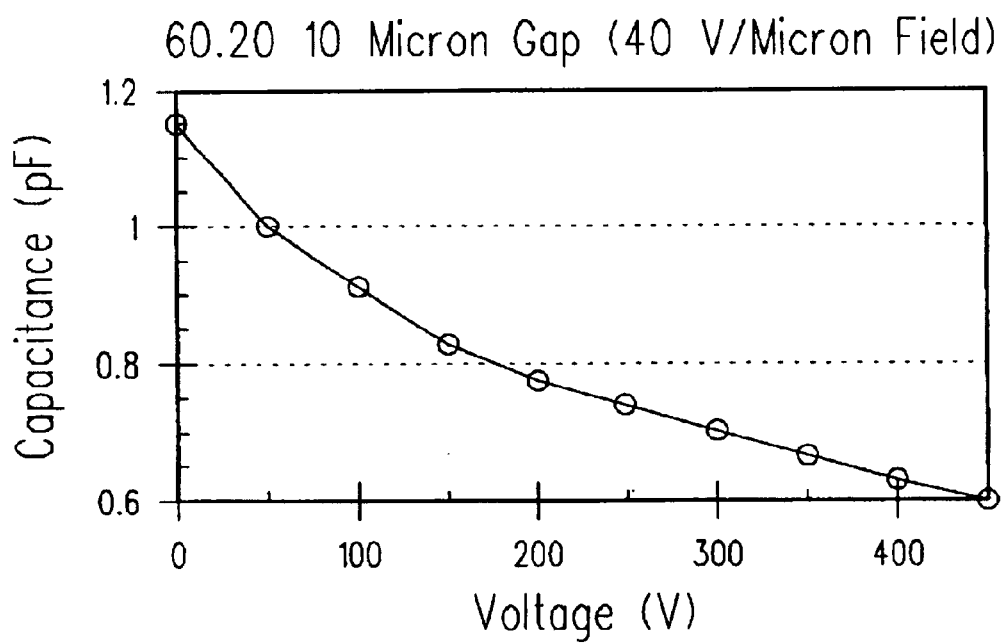
FIG. 8 is a graph of capacitance versus voltage for a $Ba_{0.60}Sr_{0.40}TiO_3$/20 weight percent MgO thick film single gap planar varactor with 40 V/$\mu$m demonstrated field strength.

Varactors patterned on the composite thick films were evaluated. A varactor pattern 10 is shown in FIGS. 7a and 7b. The varactor 10 includes a ceramic substrate 12, an electronically tunable thick film composite 14, and a patterned metal layer 16 forming a gap g. The high voltage breakdown strength of the thick film composite varactor is shown in FIG. 8. The thick film can withstand over 40 V/$\mu$m. The power handling capability is over 4–10 Watts/film and can be increased by ~5 when used in multiple pole RF devices.

Figure 9:
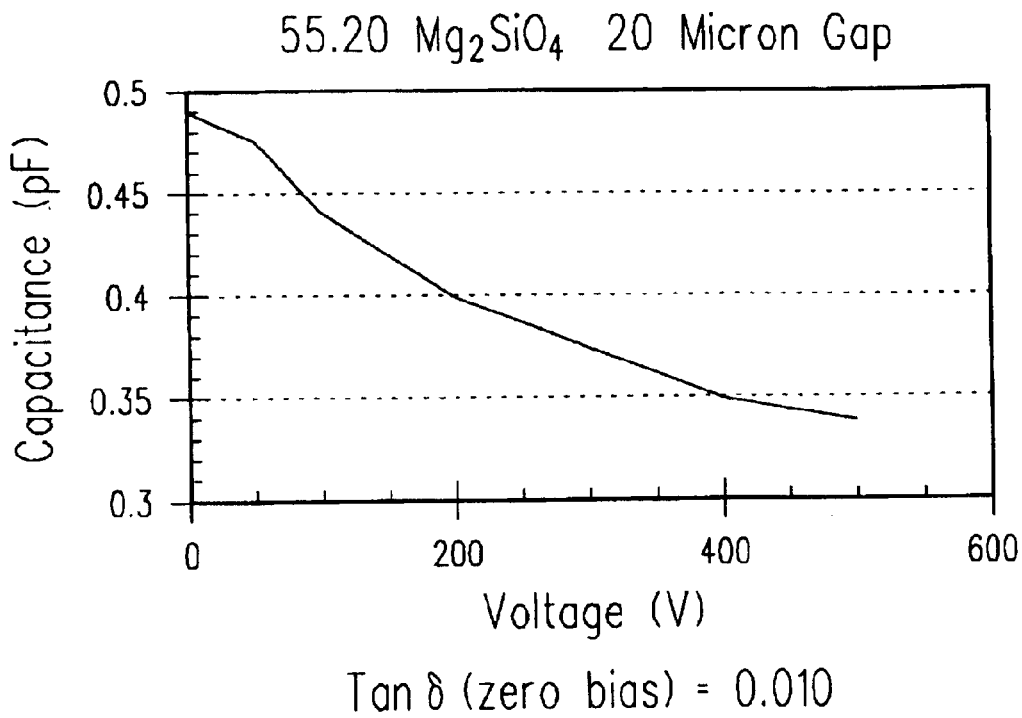
FIG. 9 is a graph of capacitance versus voltage for a $Ba_{0.55}Sr_{0.45}TiO_3$/20 weight percent $Mg_2SiO_4$ thick film single gap planar varactor.

Another $Ba_{0.55}Sr_{0.45}TiO_3/20$ weight percent $Mg_2SiO_4$ composite material demonstrates excellent microwave properties, as shown in FIG. 9.

Figure 10:
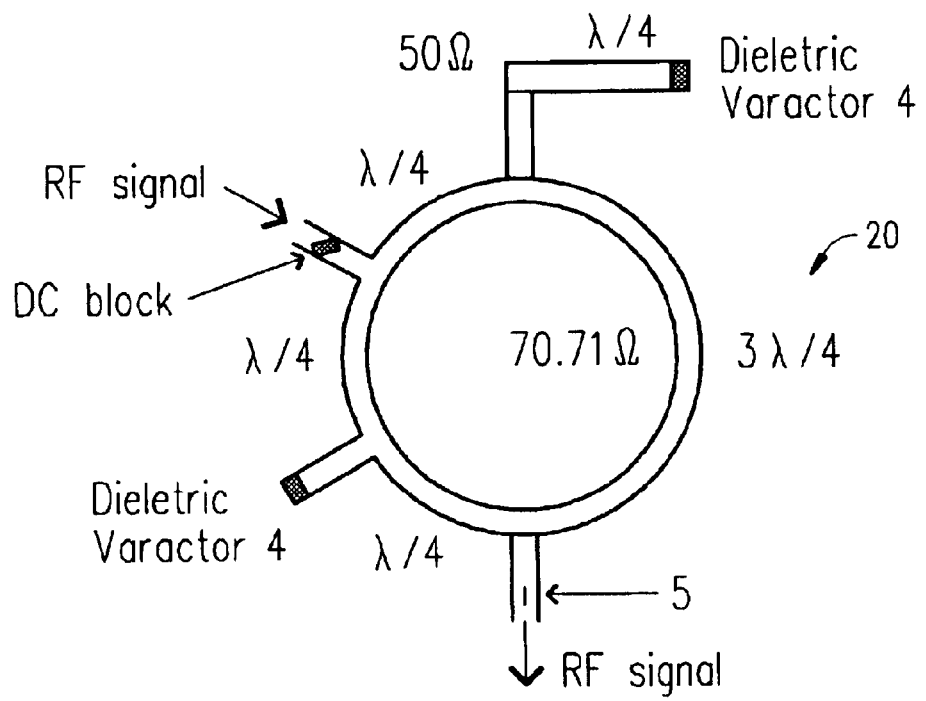
FIG. 10 is a schematic top view of a 2 GHz analog reflective termination phase shifter with a rat-race hybrid coupler and thick film tunable dielectric varactors.
Figure 11:
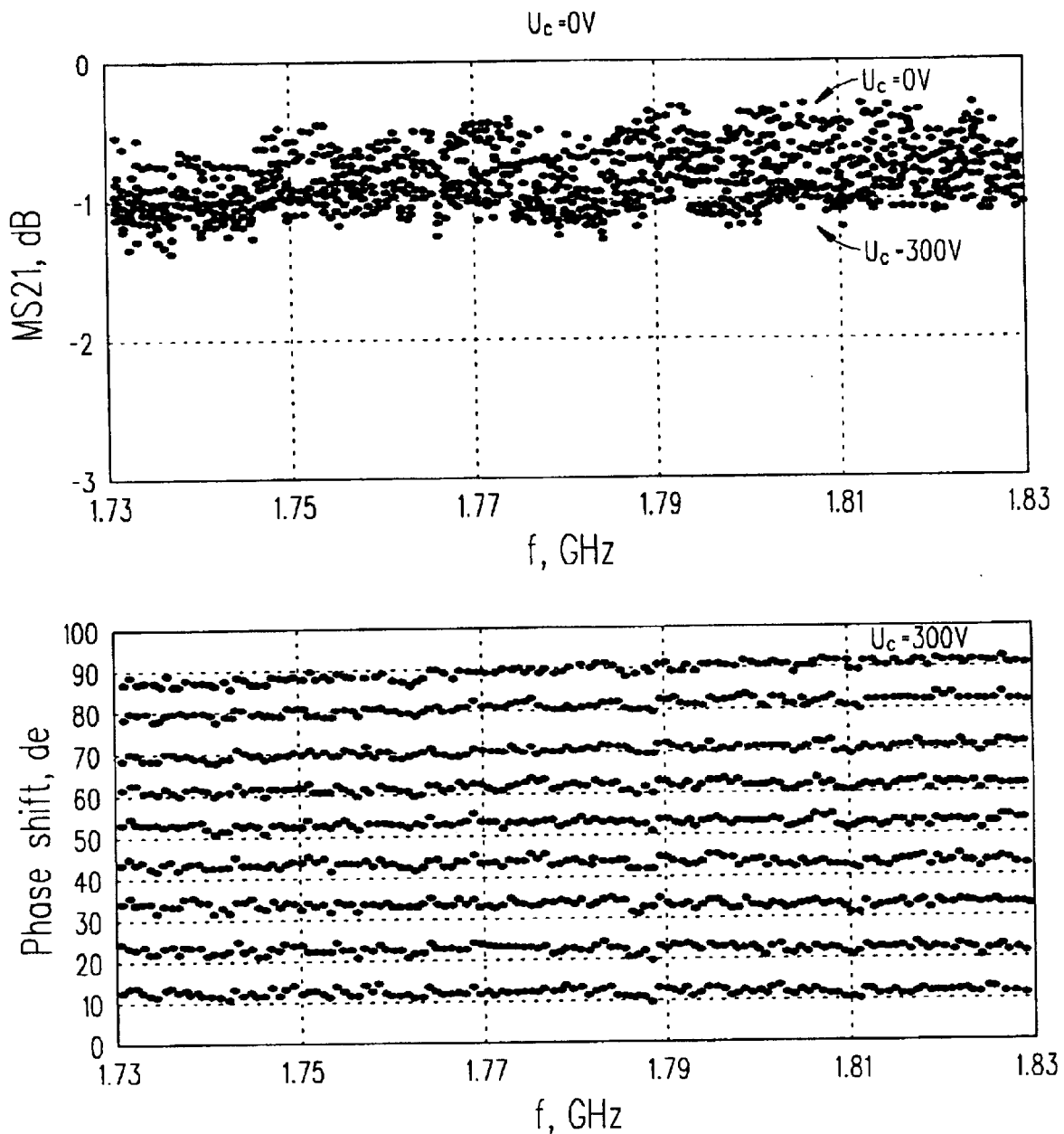
FIG. 11 are plots of measured phase shift and loss tangent of a 2 GHz phase shifter incorporating an electronically tunable thick film composite of the present invention.

FIGS. 10–11 show the design and performance of a hybrid coupler rat race phase shifter centered at 1.8 GHz. The construction 20 contains a rat-race coupler, two reflective terminations and a bias circuit. The reflective terminations consist of a series combination of a tunable dielectric varactor and an inductor. Two dc blocks are mounted on the arms of the input and output. The DC block may be a surface mounted capacitor or a distributed passband filter. The figure-of-merit is 110–150 deg/dB, relative phase shift error is less than 3 percent in the operation frequency range of 1.8–1.9 GHz. The insertion losses of 0.9 dB include 0.5 dB of mismatch and metal loss.

Figure 12:
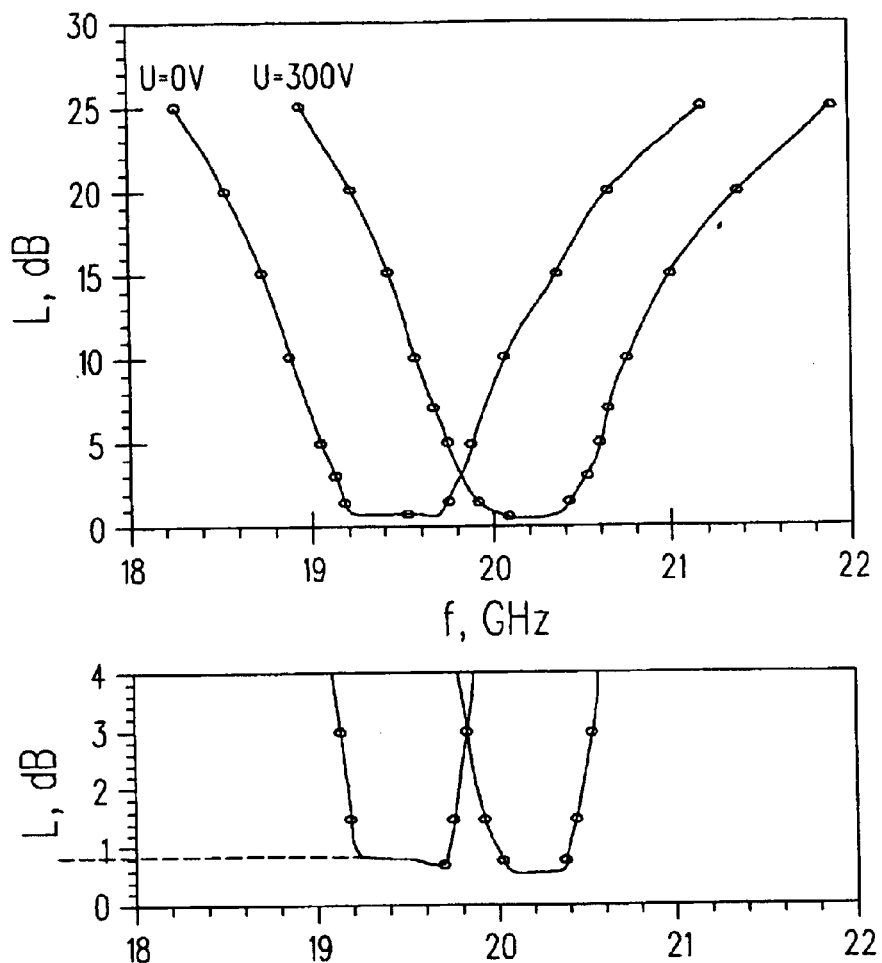
FIG. 12 is measured data for a 20 GHz fin line tunable filter incorporating an electronically tunable thick film composite of the present invention.
Figure 13:
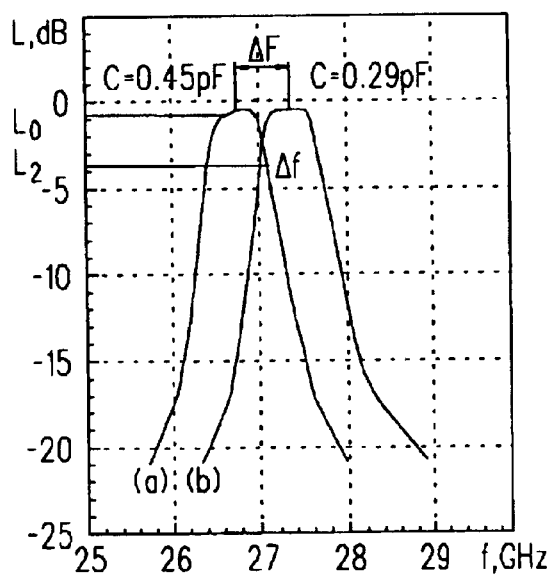
FIG. 13 is measured data for a 28 GHz fin line tunable filter incorporating an electronically tunable thick film composite of the present invention.

FIGS. 12 and 13 show the measured response of a tunable filter. A fin line structure that incorporates four voltage tunable planar single gap varactors may be used. The fin line construction is comprised of three structures that include either foil plates or a printed circuit board configuration. This is placed at the center of the waveguide. The central plate is insulated from the waveguide by mica. Two tunable dielectric varactors are soldered in the end of every fin line resonator between the plates or on the printed structure.

As shown in FIG. 12, in the frequency range of the tuning of 18 to 22 GHz, ΔF is approximately 0.8 GHz (about 4 percent). The filter demonstrates a bandwidth of approximately 2 percent. The reflection coefficient for the central frequency was not more than −20 dB for any point of the tuning range. The number of bands (f) of the filter which was contained in this frequency range of the tuning (F) was about F/f 2.

As shown in FIG. 13, in the frequency range of the tuning of 25 to 29 GHz, ΔF is approximately 0.6 GHz (about 2.2 percent). The filter demonstrates a bandwidth of approximately 2.8 percent. Both filters have demonstrated insertion losses less than 1 dB.

Figure 14A:
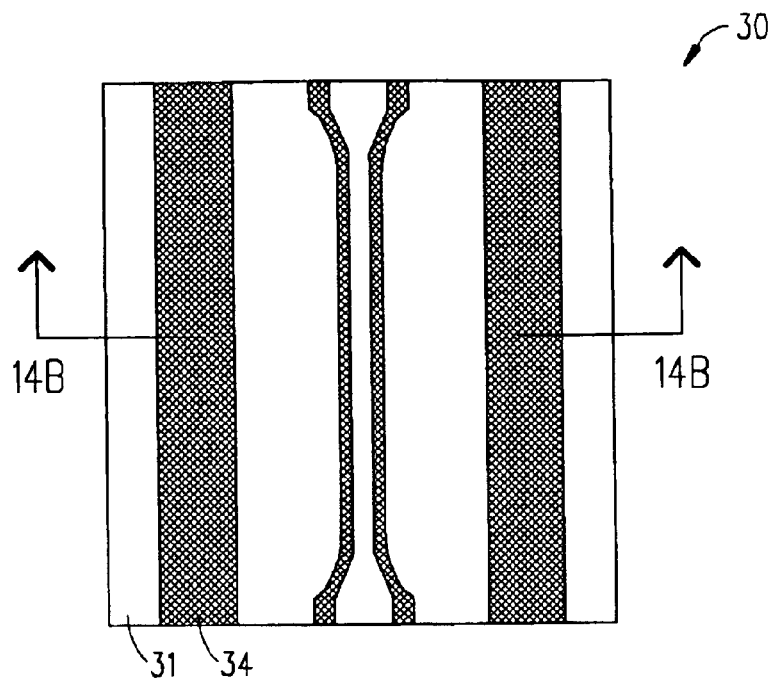
FIGS. 14a and 14b are top and side views schematically illustrating the design of a co-planar phase shifter using thick film tunable dielectrics of the present invention.
Figure 14B:
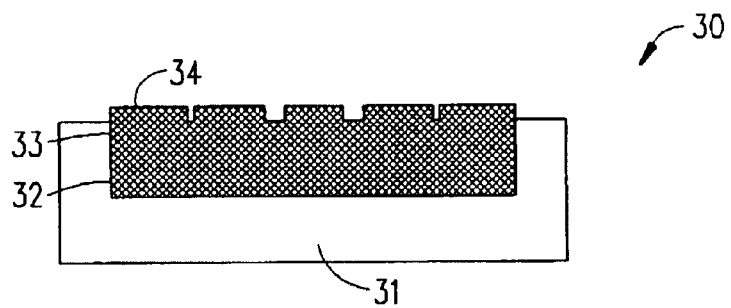

In addition, the present thick film composites can be used to fabricate planar transmission line devices 30, such as the one shown in FIGS. 14a and 14b comprising a metal holder 31, a ceramic substrate 32 such as MgO, an electronically tunable thick film composite 33, and a coplanar waveguide 34. The main planar transmission line of the waveguide 34 has a characteristic impedance of around 20 ohms. Two tapered co-planar lines are added to the ends of the main co-planar line to match the 20-ohm to 50-ohm impedance. The co-planar phase shifter can be terminated with either co-planar or microstrip lines. For the latter case, the 50-ohm co-planar waveguide is transformed to the 50-ohm microstrip line by direct connection of the central line of the co-planar line to the microstrip line. The ground planes of the co-planar line and the microstrip line are connected through the side edges of the substrate. The phase shift comes from application of dc voltage across the gaps of the co-planar line.

Figure 15:
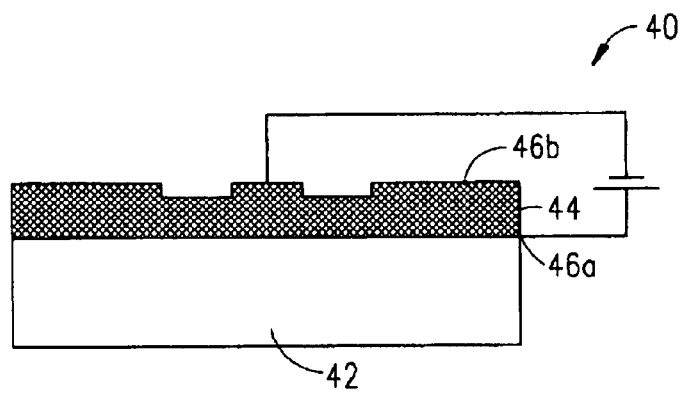
FIG. 15 is a side view of an alternate construction of the co-planar phase shifter illustrated in FIGS. 14a and 14b.

An alternate construction to the co-planar thick film tunable dielectric phase shifter 30 shown in FIGS. 14a and 14b is shown in FIG. 15. This construction 40 includes a bottom electrode 46a between the thick film 44 and the substrate 42, which lowers the necessary DC voltage, simplifies the bias circuit, and increases the breakdown strength of the device. An upper electrode 46b is deposited on the thick film 44.

Figure 16:
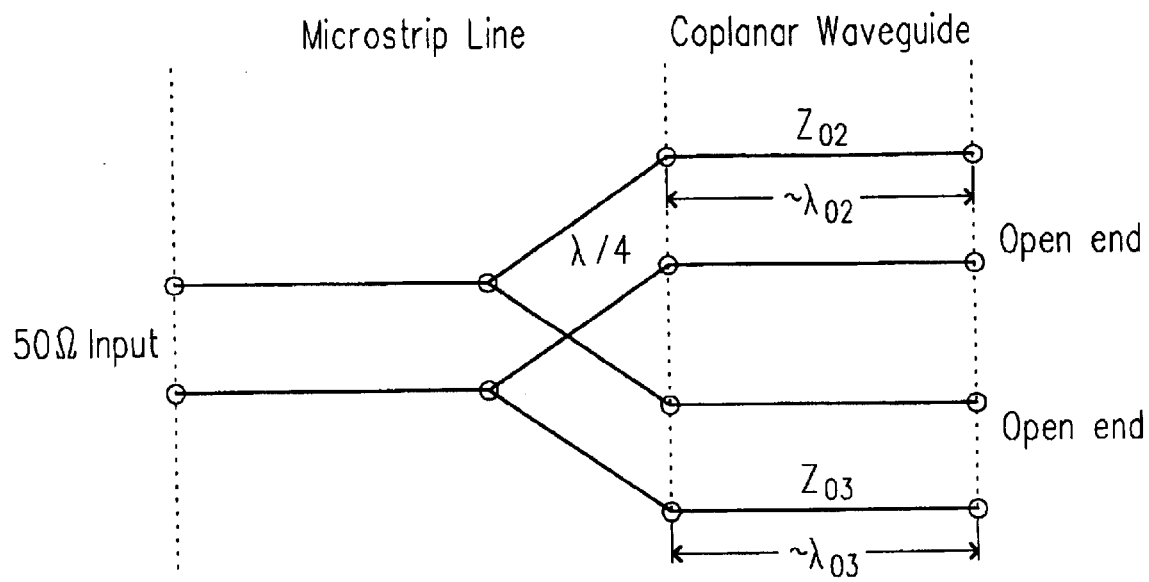
FIG. 16 schematically illustrates the design of a reflective phase shifter using thick film tunable dielectrics of the present invention.

Reflective phase shifters such as the one schematically shown in FIG. 16 are further examples of applications of the present thick film tunable dielectric composites. The phase shifter has a 50-ohm microstrip line 1 connected to the RF input and output. The 50-ohm microstrip line is equally divided into two quarter wave length microstrip lines 2 with characteristic impedance of about 70 ohms. The two quarter-wave length microstrip lines 2 are transformed into co-planar waveguide (CPW) 3, and matched into lines 1 and 3. The two CPW lines 3 have characteristic impedance of about $Z_{o2}$=15 ohms and $Z_{o3}$=18 ohms, respectively. The $Z_{o2}$ and $Z_{o3}$ correspond to zero bias voltage. The resonant frequencies of the CPW resonators are slightly different and are determined by the electrical lengths of $Z_{o2}$ and $Z_{o3}$. The slight difference of the $Z_{o2}$ and $Z_{o3}$ are helpful in reducing the phase error with a wide bandwidth. Phase shifting is accomplished by changing the dielectric constant of the thick film by application of a DC voltage across the gaps of the CPW 3. The electrical lengths, $Z_{o2}$ and $Z_{o3}$, and the bias voltage across the CPW determine the amount of phase shift. The ground planes of the CPW and the microstrip line are connected through the side edges of the substrate. The RF signal is reflected at the open ends of the CPW.

Figures 17A, 17B:
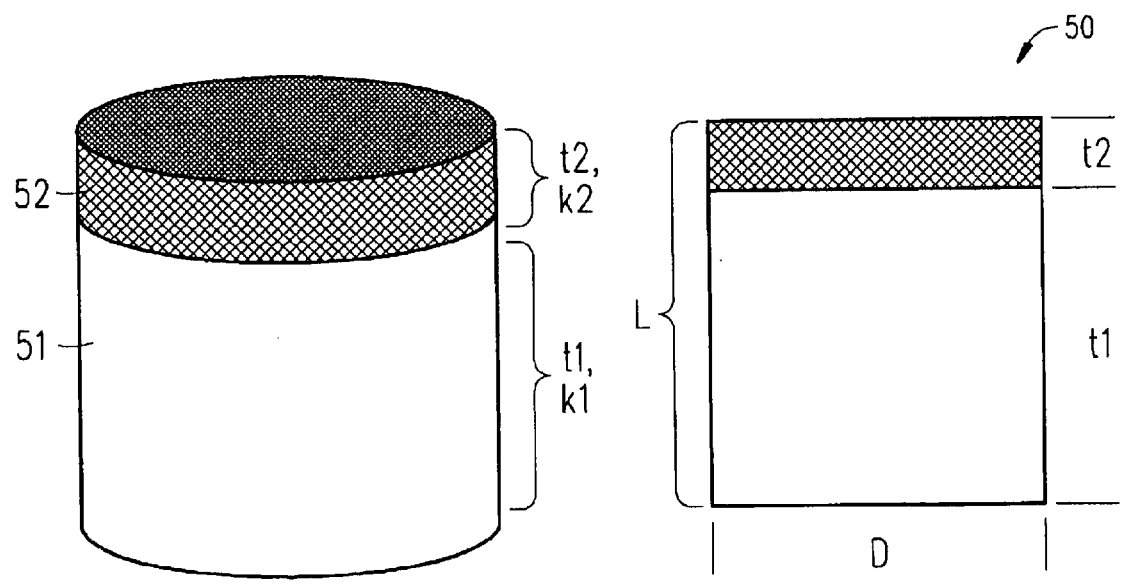
FIGS. 17a and 17b are perspective and side views schematically illustrating the design of a tunable resonator incorporating an electronically tunable thick film composite of the present invention.

Another alternate construction 50 for a tunable filter containing tunable resonator using the present tunable dielectric thick films in a vertical or planar configuration is schematically shown in FIGS. 17a and 17b. The resonator can be tuned by a tunable varactor or directly (as shown) with a tunable dielectric thick film. FIGS. 17a and 17b show a non-tunable dielectric resonator onto which a thick film tunable dielectric is deposited. The following calcuation illustrates an example of the operation of such a tunable resonator. The non-tunable material 51 has a thickness of t1=19 mils and a dielectric constant of k1=50. The tunable dielectric thick film 52 has a thickness of t2=1 mil and a dielectric constant (at zero bias) k2=300 and a tunability of 50 percent, at 8 V/um. The effective dielectric constant, k, where t=t1/(t1+t2), equal to k=t*k1+(1−t)*k2=62.5.

The dielectric constant tunable film under 8 V/$\mu$m bias, which is 203.2 V, k2=150. The total k=t*k1+(1−t)*k2=55 and the tuning of the resonator=12 percent. The resonating frequency (F) at non-bias, in this case, using, k=62.5, L=t1+t2=20 mils=0.2" and D=the diameter=0.5":

$$f = \frac{8.553}{\sqrt{k}\left(\frac{\pi}{4}D^2L\right)^{1/3}}$$

Under bias, with k=55, the frequency shifts to from 3.18GHz to 3.39 GHz. This represents a total shift in frequency of resonating freq.=(3.39−3.18)/sqrt(3.18*3.39)=6.4 percent. A tunable resonator can also be constructed using the varactors shown in FIGS. 7a and 7b.

Figure 18:
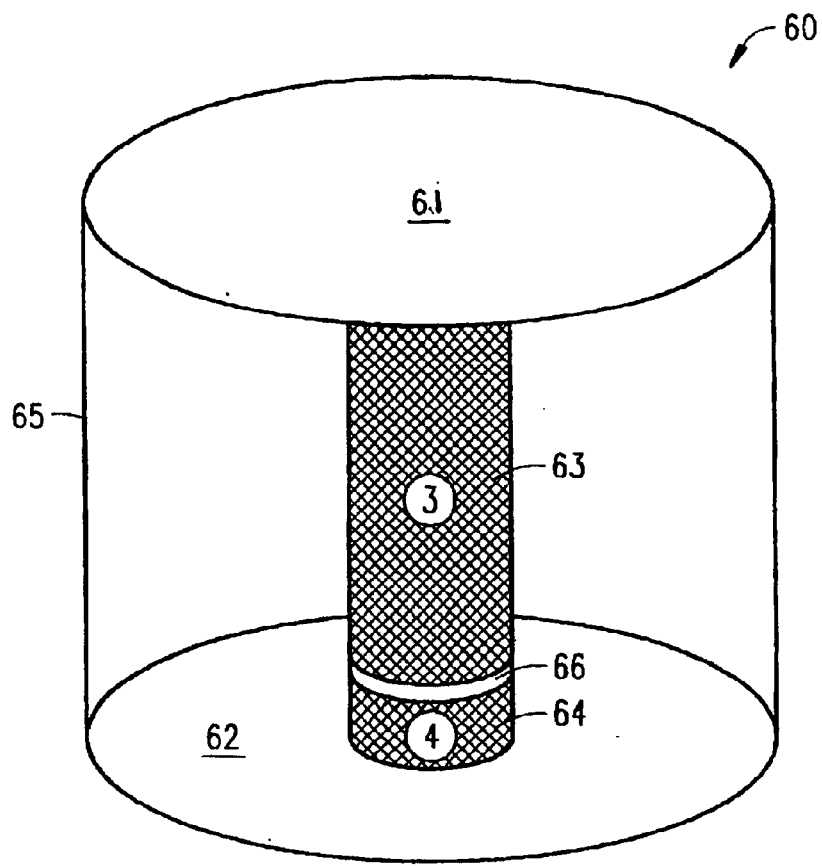
FIG. 18 is a perspective view schematically illustrating the design of a varactor tuned resonator incorporating an electronically tunable thick film composite of the present invention.

An air-filled varactor tuned combline resonator 60 is schematically shown in FIG. 18. The resonator 60 includes a metal top plane 61, a metal bottom plane 62, a metal inner post 63, 64, a metal side enclosure 65, and a tunable dielectric thick film varactor 66. Without the varactor 66 embedded in the structure, it is an air-filled conventional combline resonator. Since the gap between the inner rods 63 and 64 is usually designed small, larger capacitance is created, which greatly results in the reduction of the resonator length. If we put the varactor in the gap, the capacitance of this capacitor can then be tuned by applying the voltage on the varactor. Electrically, the length of the resonator is changed, i.e., the resonant frequency of the resonator is electronically tuned. A 10 percent tunability by using the tunable dielectric varactor can be expected.

Figure 19:
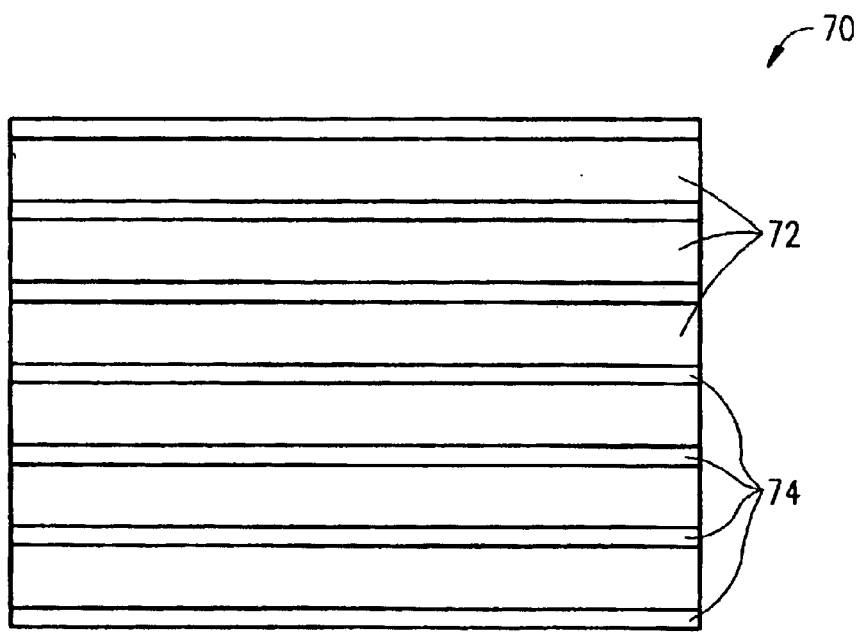
FIG. 19 is a partially schematic side view of a multi-layer structure comprising layers of electronically tunable thick film composites between thin film metallization layers in accordance with an embodiment of the present invention.

FIG. 19 is a partially schematic side sectional view of a multi-layer structure 70 comprising multiple layers of the electronically tunable thick film composite 72, and multiple thin film metalization layers 74.

The metallization of the voltage tunable thick film devices described in this invention can be accomplished by any suitable method. Typical metallization would be photolithograpic process of a thin layer of Ti with a thicker layer of gold. Thick film metallization of gold may also be used where applicable. Ground plane metallization of the vertical structures most cases will accomplished using a thick film ink such as Pt or Pd/Au.

Accordingly, the present invention, by utililizing the unique application of low loss (tan δ<0.03) thick film dielectrics of controlled dimension provides a high frequency high power varactor that surpasses the high frequency (>3 Ghz) performance of semiconductor varactors. The utilization of these varactors in tunable devices is also provided by this invention. Although several examples of varactors and other thick film devices have been illustrated herein, many other applications and modifications of devices may be obvious to those skilled in the art.

Whereas particular embodiments of this invention have been described above for purposes of illustration, it will be evident to those skilled in the art tat numerous variations of the details of the present invention may be made without departing from the invention as defined in the appended claims.

What is claimed is:

1. An electronically tunable thick film dielectric composite material having a thickness of from about 2 to about 25 microns, fabricated using screen printing and comprising at least one electronically tunable dielectric phase and at least one substantially non-tunable dielectric phase, wherein the material has a tunability of at least 1 percent under an applied electric field of 2 V/micron.

2. The electronically tunable thick film dielectric composite material of claim 1, wherein the tunability is at least 5 percent.

3. The electronically tunable thick film dielectric composite material of claim 1, wherein the material exhibits a loss tangent of less than 0.03 at a frequency of 10 GHz.

4. The electronically tunable thick film dielectric composite material of claim 1, wherein the loss tangent is less than 0.02.

5. The electronically tunable thick film dielectric composite material of claim 1, wherein the material has a thickness of from about 3 to about 15 microns.

6. The electronically tunable thick film dielectric composite material of claim 1, wherein the at least one electronically tunable dielectric phase comprises barium strontium titanate.

7. The electronically tunable thick film dielectric composite material of claim 1, wherein at least a portion of the barium strontium titanate is provided from sub-micron particles.

8. The electronically tunable thick film dielectric composite material of claim 1, wherein the at least one substantially non-tunable dielectric phase comprises at least about 5 weight percent of the composite material.

9. An electronically tunable device comprising:
   a ceramic substrate; and
   at least one electronically tunable thick film composite material, that has a thickness of from about 2 to about 25 microns, including at least one electronically tunable dielectric phase and at least one substantially non-tunable dielectric phase, and being positioned on the ceramic substrate, wherein the composite material has a tunability of at least 1 percent under an applied electric field of 2 V/micron.

10. A multilayer electronically tunable device comprising:
   at least one layer of an electronically tunable thick film dielectric composite material, that has a thickness of from about 2 to about 25 microns, including at least one electronically tunable dielectric phase and at least one substantially non-tunable dielectric phase, wherein the composite material has a tunability of at least 1 percent under an applied electric field of 2 V/micron; and
   at least one thin film metallization layer adjacent to the layer of electronically tunable thick film dielectric composite material.

11. The multilayer electronically tunable devices of claim 10, wherein the device comprises at least two layers of electronically tunable thick film dielectric composite material, and at least two of the thin film metallization layers.

12. The multilayer electronically tunable device of claim 10, wherein the electronically tunable thick film dielectric composite material and the thin film metallization layer are cosintered.

* * * * *